United States Patent
Tsukamoto et al.

[11] Patent Number: 5,943,592
[45] Date of Patent: Aug. 24, 1999

[54] METHOD OF MAKING A MIS TRANSISTOR

[75] Inventors: Masanori Tsukamoto; Kazuhiro Tajima, both of Tokyo, Japan

[73] Assignee: Sony Corporation, Tokyo, Japan

[21] Appl. No.: 08/876,096

[22] Filed: Jun. 10, 1997

[30] Foreign Application Priority Data

Jun. 24, 1996 [JP] Japan ..................... 8-162961

[51] Int. Cl.$^6$ .................................. H01L 21/76
[52] U.S. Cl. ................. 438/486; 438/264; 438/265
[58] Field of Search ..................... 438/264, 265, 438/482, 486, 257

[56] References Cited

U.S. PATENT DOCUMENTS 5,242,858  9/1993  Sakamoto et al. .
5,476,799  12/1995 Sakamoto et al. .
5,597,741  1/1997  Sakamoto et al. .
5,814,543  9/1998  Nishimoto et al. .

OTHER PUBLICATIONS

S. M. Sze, VLSI Technology, second edition, p. 98, 1988.

*Primary Examiner*—Charles Bowers
*Assistant Examiner*—Martin Sulsky
*Attorney, Agent, or Firm*—Ronald P. Kananen; Rader, Fishman & Grauer

[57] ABSTRACT

A making method of a semiconductor device comprising the step of forming a first silicon layer on a silicon substrate, forming a second silicon layer comprising amorphous silicon on the first silicon layer, then crystallizing the second silicon layer and further forming a conductive layer made of a metal silicide or a metal on the second silicon layer, wherein the method comprises forming an intermediate layer to the surface of the first silicon layer after forming the first silicon layer and before forming the second silicon layer, in which the interlayer film has a film thickness within such a range as electrons are conducted by direct tunneling and such a film thickness as disconnecting the succession of the crystallinity of the first silicon layer upon crystallization of the second silicon layer. Accordingly, fluctuation of Vth caused by inter-diffusion of impurities by way of the metal silicide layer is reduced in CMOS of the dual layered polysilicon polycide structure is decreased.

20 Claims, 5 Drawing Sheets

METHOD OF MAKING A MIS TRANSISTOR

BACKGROUND OF THE INVENTION

1. Field of the Invention

The present invention concerns a method of making a MIS semiconductor device.

2. Description of the Related Art

Complementary MOS transistors (hereinafter referred to as CMOS) comprising an N channel MOS field effect transistor (hereinafter referred to as NMOSFET) and a P channel MOS field effect transistor (hereinafter referred to as PMOSFET) are used generally in various devices of LSI constitution including memory LSIs and logic LSIs since they have advantageous features of low power consumption and high speed operation. In such devices, the gate length of FETs will be reduced in the future along with increasing integration degree.

For a gate electrode of PMOSFET, an N+ type electrode has been used like that in NMOSFET in view of the simplicity of the process and high performance due to buried channel type.

On the other hand, in the devices after the deep submicron generation, since the suppression of the short channel effect is difficult in the buried channel type, application of a P+ type gate as a surface channel type is effective.

For manufacturing gates of different polarities such as an N$^+$gate for an NMOS transistor and a P$^+$type gate for PMOS transistor, N type impurities such as arsenic (As) or phosphorus (P) are doped in a region to form the N$^+$type gate, while P-type impurities such as boron (B) or boron difluoride (BF$_2$) are doped in a region to form a P$^+$gate in polycrystal silicon forming the gate electrode. As described above, gates of different conduction types are formed by implanting impurities of different conduction types selectively in most cases.

However, in a case of forming a gate electrode by using a wiring structure in which polycrystal silicon and metal silicide are stacked (polycide structure) or in a case of forming a electrode by using a wiring structure in which polycrystal silicon and metal are stacked, the diffusion rate of impurities in the metal silicide is extremely higher compared with the diffusion speed of impurities in silicon or silicon oxide (by about 4 digits expressed as diffusion coefficient). Accordingly, P$^+$type impurities and N$^+$type impurities take place inter-diffusion to compensate impurities in polycrystal silicon.

The Fermi level in the polycrystal silicon fluctuates by such an inter-diffusion phenomenon and the gate electrode is depleted upon application of a gate voltage to fluctuate a threshold voltage (hereinafter referred to as Vth) and results in deterioration of device characteristics.

Further, in the P$^+$type gate, boron diffuses into a gate oxide film and further reaches as far as a substrate to result in problems such as fluctuation of Vth of MOSFET and lowering of the reliability of the gate oxide film. Particularly, it is known that if fluorine is contained in the polycrystal silicon or gate oxide film, the diffusion rate of boron is increased. Accordingly, it is demanded for optimizing the structure and the making fabrication such that fluorine is not diffused into the polycrystal silicon or gate oxide film.

Then, the subject concerning a dual gate CMOS formed by the related art is to be explained specifically with reference to FIG. 1.

As shown in FIG. 1, a silicon substrate 1 is separated by a field oxide film 2 into an NMOSFET region and a PMOSFET forming region and a gate oxide film 3 is formed on the silicon substrate 1. Then, a tungsten silicide (WSi$_x$) layer 5 is stacked on the upper surface of a polycrystal silicon layer to form a tungsten polycide structure. In such a tungsten polycide structure, N type (for example phosphorus) impurities are doped in the polycrystal silicon layer 4N and P type (for example, boron) impurities are doped in a polycrystal silicon layer 4P of PMOS transistor.

Then, when a high temperature heat treatment (for example, activating annealing) is applied, phosphorus diffuses through the tungsten silicide layer 5 and diffuses into the polycrystal silicon layer 4P of the P type gate, while boron diffuses through the tungsten silicide layer 5 and diffuses into the polycrystal silicon layer 4N of the N type gate.

Accordingly, Fermi level in the gate electrode fluctuates, and the gate electrode is depleted upon application of the gate voltage, by which vth fluctuates to deteriorate device characteristics. Further, if fluorine is contained in the tungsten silicide layer 5, fluorine diffuses through the crystal grain boundary of the polycrystal silicon layer 4 and reaches the gate oxide film 3 to cause so-called punch through of boron to the silicon substrate 1.

Further, for suppressing inter-diffusion between P$^+$ type impurities and N$^+$ type impurities, it has been reported a technique of rendering the composition of tungsten silicide to a so-called silicon rich state with an aim of reducing the diffusion rate in the tungsten silicide layer. This mechanism is adapted to break the chained structure of tungsten and eliminate the diffusion path by rendering the composition of the tungsten silicide to the so-called silicon rich state.

However, if the compositional ratio of silicon in the tungsten silicide layer 5 is excessively increased, resistance value of the tungsten silicide layer 5 is increased, which results in increase of wiring resistance and delay of circuit operation.

Accordingly, the above-mentioned method is not always advantageous.

On the other hand, there is disclosed a method of using polycrystal silicon of large grain size for the polycrystal silicon layer 4, particularly, a method of adopting a dual layer structure for the polycrystal silicon layer 4 and forming the upper polycrystal silicon layer by polycrystal silicon of large grain size. That is, the crystal grain boundary of polycrystal silicon is decreased by increasing the grain size of the polycrystal silicon to suppress diffusion of fluorine or dopant.

Usually, deposition of polycrystal silicon (or amorphous silicon) in the upper layer is conducted directly after the removal of a spontaneous oxide film by using an aqueous fluoric acid solution.

However, if the increase of the grain size in the upper silicon layer is conducted by solid phase growing from amorphous silicon, it causes epitaxial growth in succession of the crystal state of polycrystal silicon in the lower layer. Therefore, the grain size of the polycrystal silicon in the upper silicon layer is not always increased.

OBJECTS AND SUMMARY OF THE INVENTION

A first object of the present invention is to provide a method of making a MISFET for reducing fluctuation of Vth.

A second object of the present invention is to prevent inter-diffusion between different conduction layers by increasing the grain size in a polysilicon layer.

The present invention provides a method of making a semiconductor device which comprises:

a step of forming a first silicon layer on a substrate, a step of forming a second silicon layer comprising an amorphous silicon on the first silicon layer, a step of crystallizing the second silicon layer, and a step of forming a conductive layer comprising a metal silicide or a metal on the crystallized second silicon layer, wherein the method comprises a step of forming an interlayer film to the surface of the first silicon layer after forming the first silicon layer and before forming the second silicon layer, in which the interlayer film has a film thickness within such a range as electrons in the first and the second silicon layers are electrically conducted by direct tunneling and such a film thickness as disconnecting the succession of the crystallinity of the first silicon layer upon crystallization of the second silicon layer.

The present invention further provides a making method of a semiconductor device which comprises:

a step of forming a first silicon layer on a substrate, a step of forming a second silicon layer comprising an amorphous silicon on the first silicon layer, a step of doping n type impurities in a first region of the second silicon layer and doping p-type impurities in a second region of the second silicon layer, a step of crystallizing the second silicon layer and diffusing the n-type impurities and the p-type impurities doped in the second silicon layer into the first silicon layer, a step of forming a conductive layer comprising a metal silicide or a metal on the crystallized second silicon layer, wherein the method comprises a step of forming an interlayer film to the surface of the first silicon layer after forming the first silicon layer and before forming the second silicon layer, in which the interlayer film has a film thickness within such a range as electrons in the first and the second silicon layers are electrically conducted by direct tunneling and such a film thickness as disconnecting the succession of the crystallinity of the first silicon layer upon crystallization of the second silicon layer.

As described above, since the present invention comprises a step of forming the interlayer film to the surface of the first silicon layer after forming the second silicon layer and before forming the second silicon layer, in which the interlayer film has a film thickness within such a range as electrons in the first and second silicon layers are conducted by direct tunneling and such a film thickness as disconnecting the succession of the crystallinity of the first silicon layer upon crystallization of the second silicon layer, so that the succession of the crystallinity of the first silicon layer is disconnected upon crystallization of the second silicon layer, the second silicon layer is not crystallized with the succession of the crystallinity of the first silicon layer. Therefore, it is possible for the large grain size crystallization of the second silicon layer. In addition, since diffusion of fluorine or boron into the first silicon layer, if the constitution of the silicon layer, the interlayer film and the second silicon layer is applied to the gate of the MOS transistor, fluctuation of Vth caused by punch through of boron through the gate oxide film formed below the first silicon layer can be suppressed.

Further, according to the present invention, inter-diffusion between N type impurity and P type impurities through the conductive layer with each other is suppressed by the increased grain size of the second silicon layer. Accordingly, when the constitution of the first silicon layer, the interlayer film and the second silicon layer is applied to the gate of the MOS transistor, Vth fluctuation can be suppressed.

Further, the interlayer film comprises a silicon oxide film and has a thickness of from 0.5 nm to 3 nm.

Therefore, the silicon oxide film has such a thickness as electrons in the second silicon layer are conducted by direct tunneling to ensure conduction between the first silicon layer and the second silicon layer. Further, since the oxide silicon film of this film thickness disconnects the succession of the crystallinity of the first silicon layer upon crystallization of the second silicon layer, it is possible for increasing the grain size of the second silicon layer with no succession of the crystallinity of the first silicon layer.

If the silicon oxide film is formed to a thickness in excess of 3 nm, the silicon oxide film does not cause direct tunneling. Therefore, conduction can not be attained between the first silicon layer and the second silicon layer. On the other hand, if the silicon oxide film is formed to a thickness of less than 0.5 nm, the second silicon layer is crystallized with succession of the crystallinity of the underlying first silicon layer. Therefor, the polycrystal silicon in the second silicon layer is not sometimes crystallized in the large grains.

DETAILED DESCRIPTION OF THE PREFERRED EMBODIMENT

Description will be made to an example of a first embodiment according to the present invention with reference to views for manufacturing steps in FIGS. 2A to F.

FIGS. 2A to 2F show CMOSFET of a dual gate structure as an example.

FIGS. 2A to 2D show schematic cross sectional views along the direction of a gate width, and 2E and 2F are schematic cross sectional views in the longitudinal direction of the gate.

Figure 1:
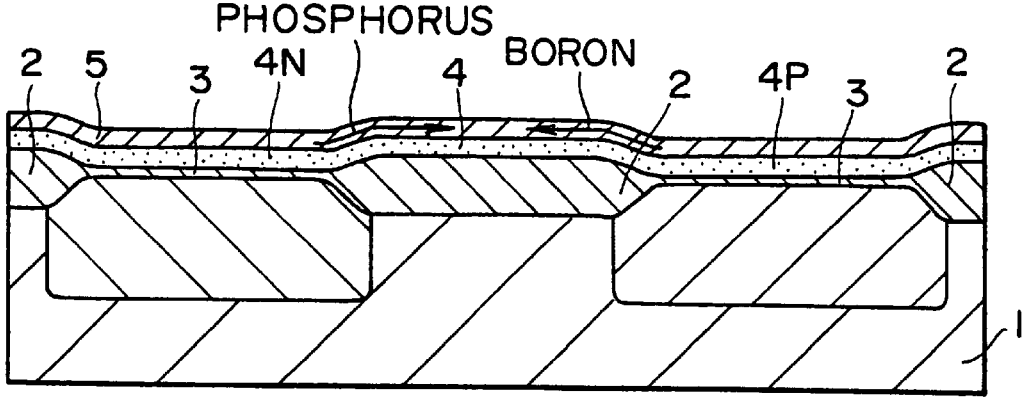
FIG. 1 is a schematic cross sectional view of a CMOS structure illustrating the related art.
Figure 2A:
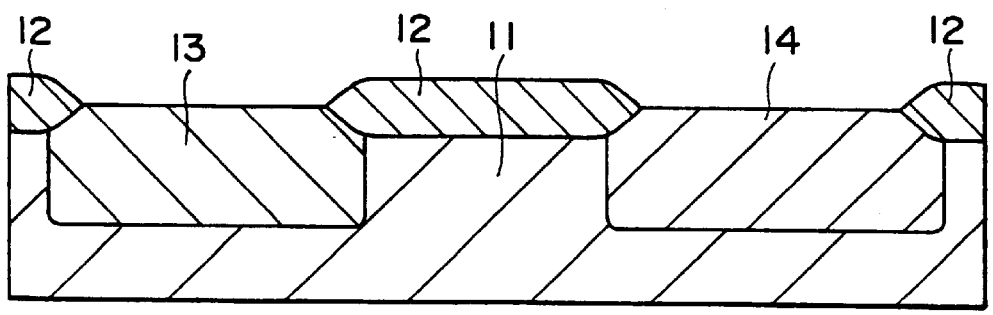
FIGS. 2A to F are views showing making steps for a first embodiment of a CMOS structure according to the present invention.

As shown in FIG. 2A, a field oxide film 12 for separating a region of forming NMOSFET and a region of forming PMOSFET is formed on a silicon substrate 11 by a local oxidation method (for example, LOCOS (local oxidation of silicon) i.e., wet oxidation at 950° C. is used, for example, for oxidation).

Then, ion implantation for forming P-well region and a buried layer with an aim of inhibiting punch through of a transistor, ion implantation for adjusting Vth and the like are conducted to form an NMOS channel region 13.

In the same manner, a PMOS channel region 14 is formed to a region for forming PMOSFET by conducting ion implantation for forming an N well region, and forming a buried layer with an aim of inhibiting punch through of a transistor, and ion implantation for adjusting Vth.

Figure 2B:
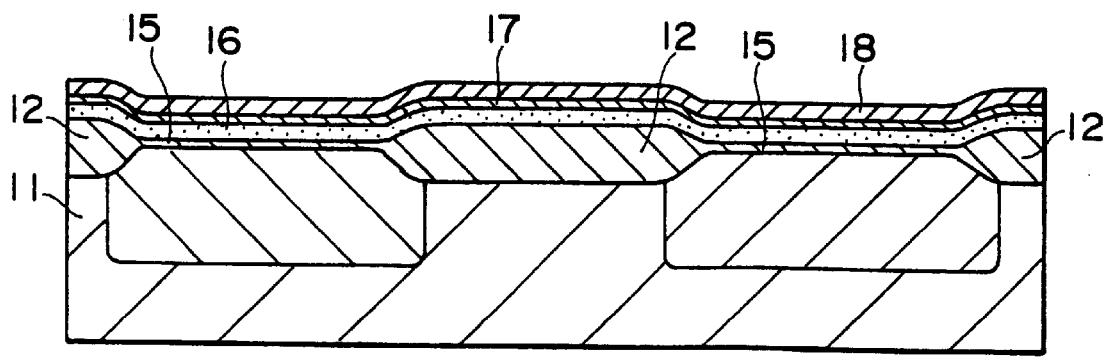

Then, as shown in FIG. 2B, a gate oxide film 15 is formed, for example, to a thickness of 6 nm to the exposed surface of the silicon substrate 11, that is, to each of surfaces of the NMOS channel region 13 and the PMOS channel region 14 by pyrogenic oxidation (oxidation in an atmosphere of hydrogen and oxygen gas mixture at 850° C.).

Successively, a first silicon layer 16 comprising polycrystal silicon is formed, for example, to a thickness of 70 nm on the field oxide film 12 and the gate oxide film 15 by a chemical vapor deposition method under a reduced pressure (hereinafter referred to as LP-CVD method). In the LP-CVD process, monosilane ($SiH_4$) was used as the starting gas and a deposition temperature was set to about 610° C.–620° C. for instance.

Then, oxidation is conducted using an aqueous solution of hydrogen peroxide and hydrogen chloride ($H_2O_2$:$HC_1$:$H_2O$=1:1:8), to form an interlayer film 17 comprising silicon oxide on the surface of the first silicon layer 16. The interlayer film 17 is formed in this embodiment to a thickness of about 1 nm.

The thickness of the interlayer film 17 should be within such a range as causing direct tunneling and such a thickness as disconnecting the succession of the crystallinity of the first silicon layer 16 upon crystallization of the second silicon layer to be described later. Accordingly, when the film is formed with silicon oxide, it is necessary to form the film to a thickness from 0.5 nm to 3 nm.

The oxidation can also be applied by using one of a liquid mixture of aqueous hydrogen peroxide and hydrofluoric acid, a liquid mixture of aqueous hydrogen peroxide and sulfuric acid and a liquid mixture of aqueous hydrogen peroxide and ammonia.

Further, a second silicon layer 18 comprising amorphous silicon is formed, for example, to a thickness of 70 nm on the inter layer film 17 by the LP-CVD method. In the LP-CVD method, monosilane was used as the starting gas and the deposition temperature was set to 550° C. for instance.

Figure 2C:
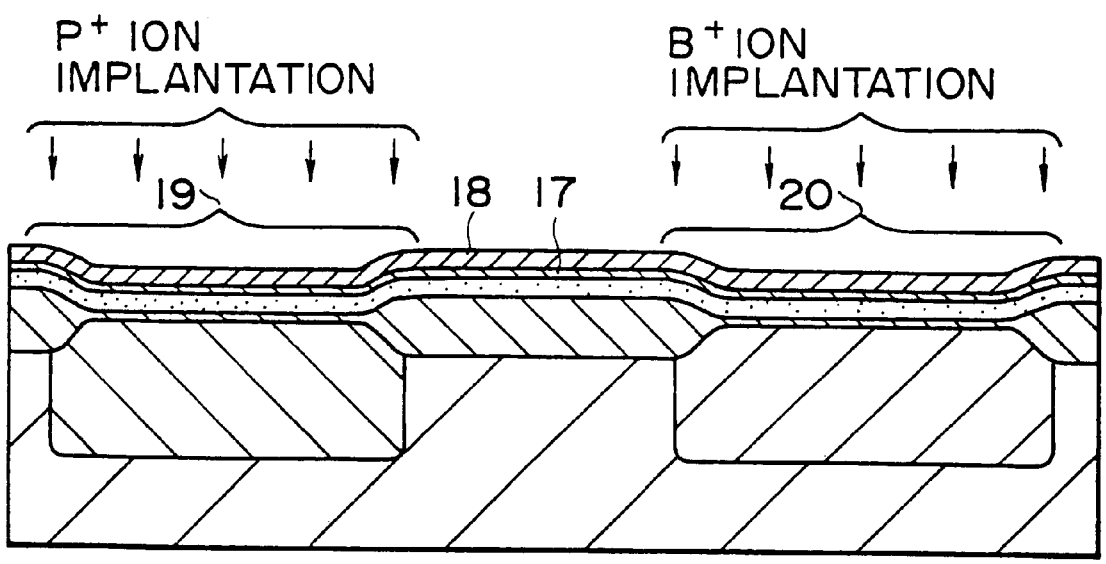

Then, as shown in FIG. 2C, phosphorus ions ($P^+$) are ion implanted as N type impurities into the second silicon layer 18 of a region forming NMOSFET (first region) by using a resist mask (not illustrated) patterned by lithography. The ion implantation conditions are set, for example, at an implantation energy of 10 KeV and a dose amount of $5 \times 10^{15}$N/$cm^2$ so as not to cause punch through of the inter layer film 17. As a result, an $N^+$type gate region 19 is formed.

After removing the resist mask, boron ions ($B^+$) are ion implanted as P type impurities into the second silicon layer 18 of a region forming PMOSFET (second region) by using a resist mask (not illustrated) patterned by lithography in the same manner. The ion implantation conditions are set, for example, at an implantation energy of 5 KeV and a dose amount of $5 \times 10^{15}$N/$cm^2$ so as not to cause punch through of the inter layer film 17. As a result, a $P^+$type gate region 20 is formed.

Subsequently, the resist mask used for an ion implantation is removed.

Figure 2D:
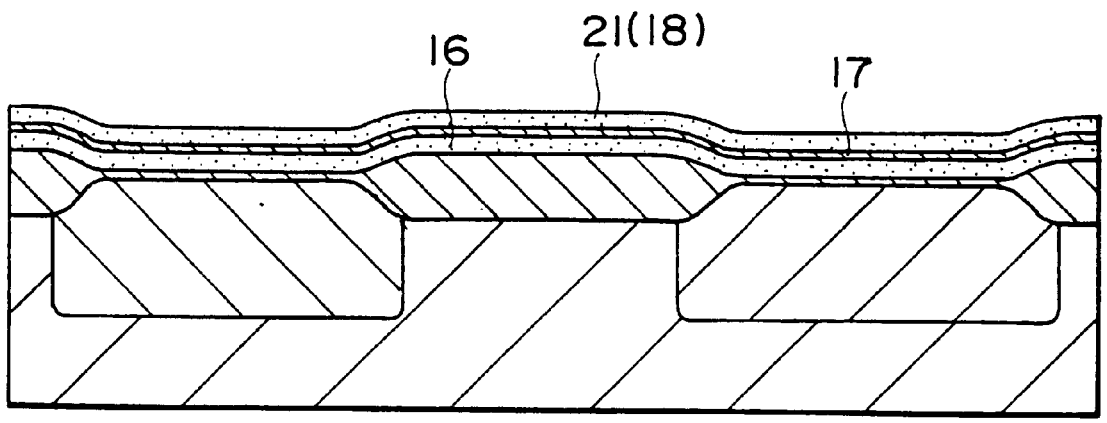

Successively, as shown in FIG. 2D, annealing is conducted in a nitrogen ($N_2$) atmosphere at 650° C. for 10 hrs to crystallize the second silicon layer 18 comprising amorphous silicon and form a polycrystal silicon layer 21 of a greater grain size than that of the first silicon layer 16.

Then, RTA (Rapid Thermal Annealing) is conducted at 1000° C. for 10 sec to diffuse the N type and P type impurities through the inter layer film 17 into the first silicon layer 16.

Figure 2E:
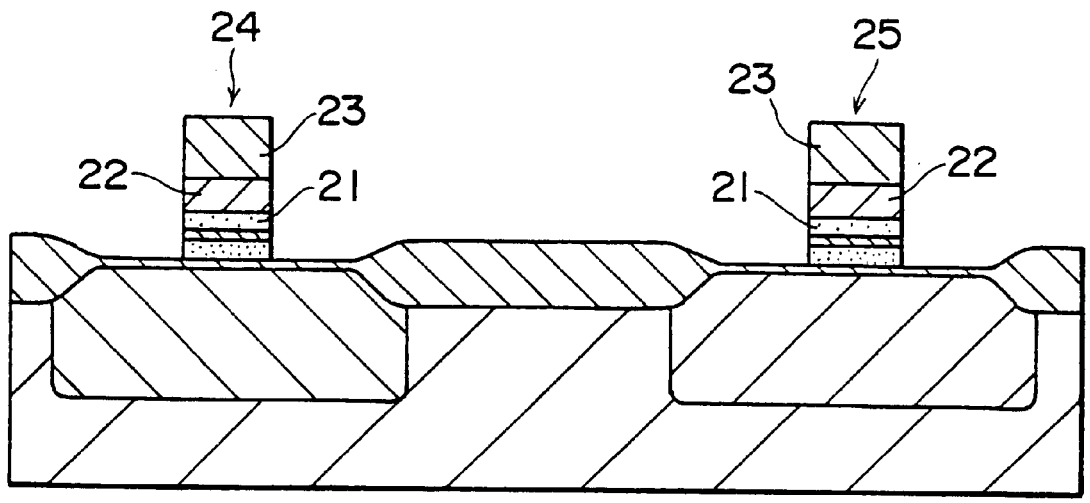

Subsequently, as shown in FIG. 2E, a conductive layer 22 comprising tungsten silicide is formed, for example, to a thickness of 70 nm on the polycrystal silicon layer 21 by the LP-CVD method. In the LP-CVD method for forming tungsten silicide, tungsten hexafluoride ($WF_6$) and monosilane ($SiH_4$) are used as the starting gas and the deposition temperature is set to 380° C., for instance.

Further, a silicon oxide film 23 is deposited, for example, to a thickness of 150 nm by a CVD method. In the CVD method for forming the silicon oxide film 23, monosilane ($SiH_4$) and oxygen ($O_2$) are used as the starting gas and the deposition temperature is set to 420° C. for instance.

As a result, a tungsten polycide wiring layer having a so-called off set oxide film is form ed.

Then, a resist film is pattered by lithography to form a resist mask (not illustrated). Then, gate electrode patterns 24 and 25 each comprising the silicon oxide film 23, the conductive layer 22, the polycrystal silicon layer 21, the interlayer film 17, and the first silicon layer 16 are formed by anisotropic etching using the resist mask described above. In the anisotropic etching, a fluorocarbon gas is used for silicon oxide, while a gas mixture of chlorine ($Cl_2$) and oxygen ($O_2$) is used for tungsten silicide.

Figure 2F:
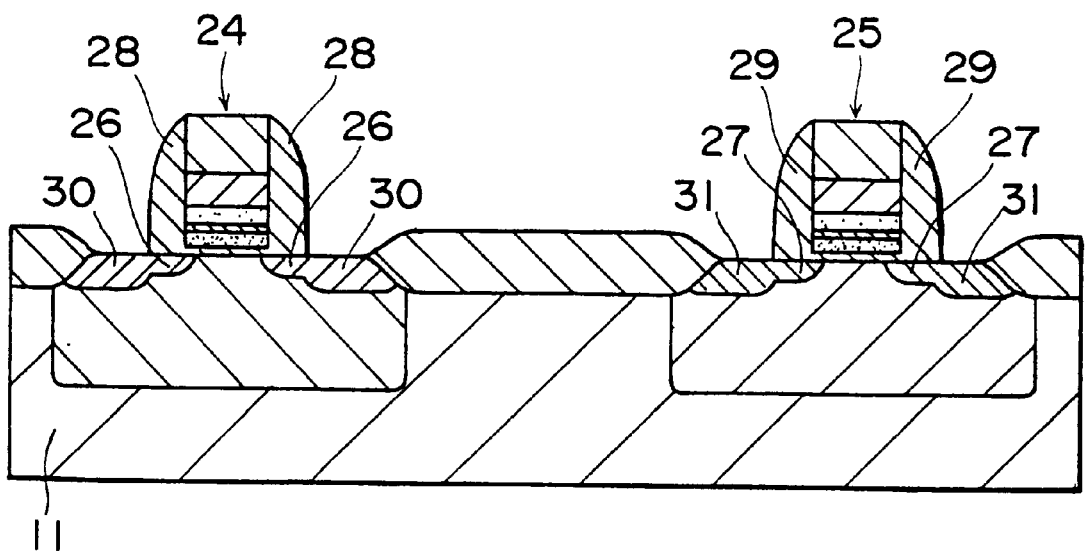

Then, as shown in FIG. 2F, arsenic ions ($As^+$) are ion implanted to the silicon substrate 11 in a region forming NMOSFET by using, as a mask, a resist mask covering the PMOSFET region formed by patterning by lithography (not illustrated) and the gate electrode pattern 24. The ion implantation conditions are set, for example, at an implantation energy of 20 KeV and at a dose amount of $5 \times 10^{13}$N/$cm^2$ for instance. As a result, an N-type LDD (Lightly Doped Drain) 26 is formed.

After removing the resist mask as described above, boron difluoride ions ($BF_2^+$) are ion implanted to the silicon substrate 11 in a region forming PMOSFET by using, as a mask, a resist mask covering the NMOSFET region formed by patterning by lithography (not illustrated) and the gate electrode pattern 25. The ion implantation conditions are set, for example, at an implantation energy of 20 KeV and at a dose amount of $5 \times 10^{13}$N/$cm^2$ for instance. As a result, a P-type LDD 27 is formed. Subsequently, the resist mask was removed.

Then, a silicon oxide film is deposited, for example, to a thickness of 150 nm in a state covering the gate electrode patterns 24, 25 by the LP-CVD method. Subsequently, the silicon oxide film is anisotropically etched to form a side wall oxide films 28, 29 on the side walls of the gate electrode patterns 24, 25, respectively.

Successively, arsenic ions ($As^+$) are ion implanted into the silicon substrate 11 in a region forming NMOSFET using a resist mask covering the PMOSFET region patterned by lithography (not illustrated), the gate electrode pattern 24 and the side wall oxide film 28 as a mask. The ion implantation conditions are set, for example, at an implantation energy of 20 KeV and at a dose amount of $5 \times 10^{15}$N/$cm^2$ for instance. As a result, an N-type source drain 30 is formed.

After removing the resist mask, in the same manner as described above, boron difluoride ions ($BF2^+$) are ion implanted to the silicon substrate 11 in a region forming PMOSFET by using, as a mask, a resist mask covering the NMOSFET region formed by patterning by lithography (not illustrated), the gate electrode pattern 25, and the side wall oxide film 29. The ion implantation conditions are set, for example, at an implantation energy of 20 KeV and at a dose amount of $5 \times 10^{15}$N/$cm^2$, for instance. As a result, an P-type source drain 31.

Subsequently, the resist mask formed by lithography was removed.

Subsequently, P-type and N-type impurities are activated by RTA (Rapid Thermal Annealing) under the conditions at 1000° C. for 10 sec.

As described above, CMOSFET is completed.

In a case of forming a single gate structure, doping into the polycrystal silicon film is conducted using only the N+ type impurities. The method of forming the structure includes, for example, ion implantation of phosphorus (P) or arsenic (As), and diffusion of phosphorus oxitrichloride ($POCl_3$).

In the first embodiment, since the interlayer film 17 comprising a thin silicon oxide film (film thickness: 0.5 nm–3 nm) is formed to the surface of the first silicon layer 16 before forming the second silicon layer 18, the succession of the crystallinity of the first silicon 16 is disconnected by the interlayer film 17 upon crystallization of the second silicon layer 18, the second silicon layer 18 is not crystallized with succession of the crystallinity of the first silicon layer 16. Therefore, the second silicon layer 18 can be formed to a polycrystal silicon layer of large grain size.

Further, when the second silicon layer 18 comprising amorphous silicon is crystallized by annealing at low temperature for a long time (650° C., 10 hrs), crystals of greater grain size can be formed as the nucleus forming rate is slower. Accordingly, nuclei are formed at random on the interlayer film 17 comprising the thin oxide film compared with that on the first silicon layer 16 comprising crystalline polycrystal silicon, thereby forming polycrystal silicon of great grain size.

In addition, since the interlayer film 17 has such a thickness that electrons in the first and the second silicon layers 16 and 18 are conducted by direct tunneling, conduction between the first silicon layer and the second silicon layer can be ensured and electric characteristics are not deteriorated.

If the interlayer film 17 is formed to a thickness of more than 3 nm, no direct channeling of electrons occurs. Therefore, conduction can not be attained between the first silicon layer 16 and the second silicon 18.

On the other hand, if the interlayer film 17 is formed to a thickness of less than 0.5 nm, the second silicon layer 18 is crystallized under the succession of the crystallinity of the underlying first silicon layer 16 upon crystallization. Accordingly, the second silicon layer 18 is not sometimes formed into the polycrystal silicon of large grain size.

Further, since diffusion of fluorine or boron into the first silicon layer 16 is suppressed by the increased grain size of the second silicon layer 18, fluctuation of Vth caused by punch through of boron in the gate oxide film 15 can be suppressed in MOSFET of the foregoing constitution.

Furthermore, inter-diffusion between the N-type impurities and the P-type impurities with each other through the conductive layer 22 is suppressed by increased grain size of the second silicon layer 18. Therefore, fluctuation of Vth is suppressed in MOSFET of the foregoing constitution.

Accordingly, it is possible to suppress the fluctuation of MOSFET characteristics caused by inter-diffusion of the N-type impurities and the P-type impurities to each other in the wiring layer, and fluctuation of MOSFET characteristics caused by punch through of boron can be suppressed without deteriorating the electric characteristics of the wiring layer, by using the wiring layer of the structure comprising the first silicon layer 16, the interlayer film 17, the second silicon layer 18 and the conductive layer 22 stacked together formed by the process as described for the first embodiment.

Further, since the interlayer film 17 comprising the silicon oxide film is formed by oxidation using an aqueous solution of hydrogen peroxide and hydrogen chloride, the silicon oxide film is formed at a good controllability for the film thickness.

Accordingly, it is possible to form a silicon oxide film of a thickness from 0.5 nm to 3 nm.

Further, the same oxidation effect as described above can be obtained by any of aqueous solutions so long as it is hydrogen peroxide type solution, for example, a liquid mixture of aqueous hydrogen peroxide and hydrofluoric acid, a liquid mixture of aqueous hydrogen peroxide and sulfuric acid, or a liquid mixture of aqueous hydrogen peroxide and ammonia.

The silicon oxide film formed by oxidation with the liquid mixture containing aqueous hydrogen peroxide is formed into a so-called porous state. Also in view of the above, electric characteristics between the first silicon layer 16 and the second silicon layer 18 are not deteriorated because of electron tunnelling between these layers through the interlayer 17.

Next, a second embodiment of the present invention will be explained as a making method of forming the interlayer film 17 comprising silicon oxide by a thermal oxidation method with reference to FIG. 3.

The process of the second embodiment is identical with the process as explained for the first embodiment except for the method of forming the interlayer film 17. Accordingly, only the thermal oxidation method is to be explained here.

Figure 3:
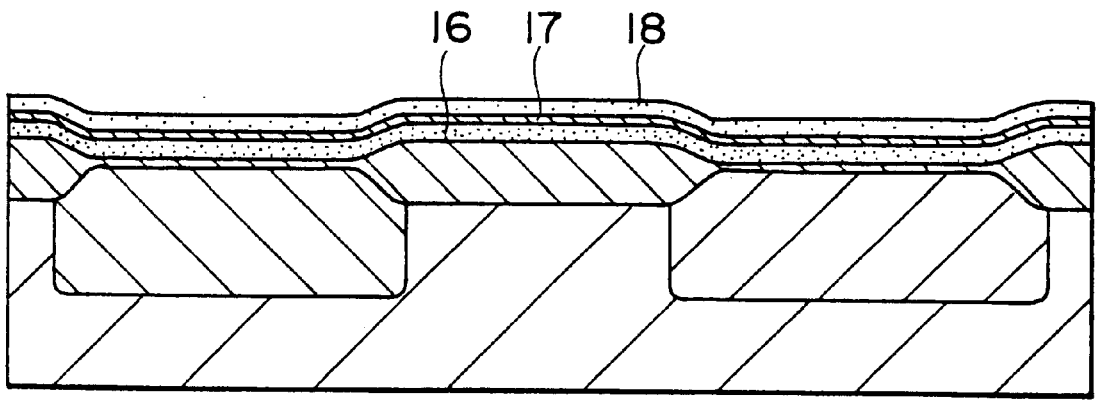
FIG. 3 is an explanatory view of a CMOS structure of a second embodiment according to the second invention.

As shown in FIG. 3, after forming a first silicon layer 16 by way of the same process as explained for the first embodiment, RTO (Rapid Thermal Oxidation) which is RTP (Rapid Thermal Process) is conducted in a dinitrogen oxide ($N_2O$) atmosphere to form an interlayer film 17 comprising silicon oxide on the surface of the first silicon layer 16. Subsequently, steps at and after forming the second silicon layer 18 are conducted in the same manner as explained for the first embodiment.

For the thermal oxidation, RTO may be conducted in an oxygen atmosphere or an atmosphere of a gas mixture of oxygen and nitrogen, or furnace oxidation may be conducted in an atmosphere of a gas mixture of oxygen and nitrogen.

Also in the case of forming the interlayer film 17 by thermal oxidation as described above, the film can be formed at a good controllability for the film thickness as explained for the first embodiment.

Then, characteristics of MOSFET using gates in which the interlayer film 17 is formed are explained with reference to FIG. 4 and FIG. 5.

Figure 4:
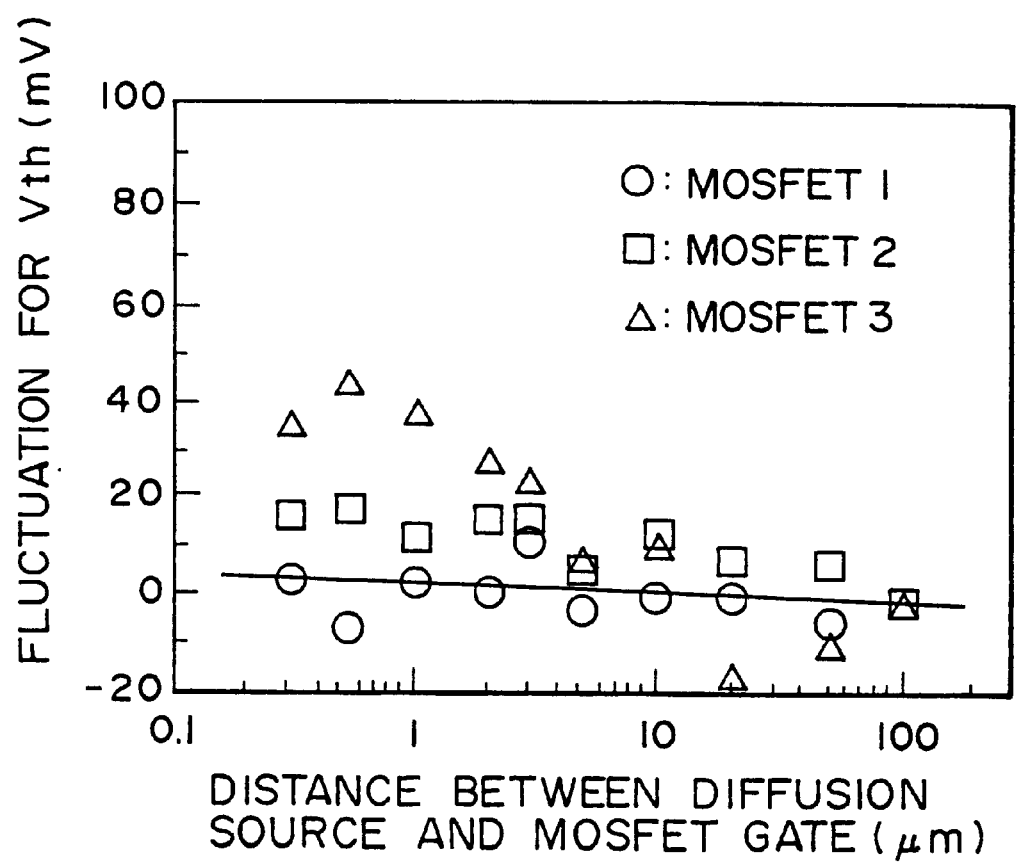
FIG. 4 is an explanatory view for the fluctuation of Vth of NMOSFET.
Figure 5:
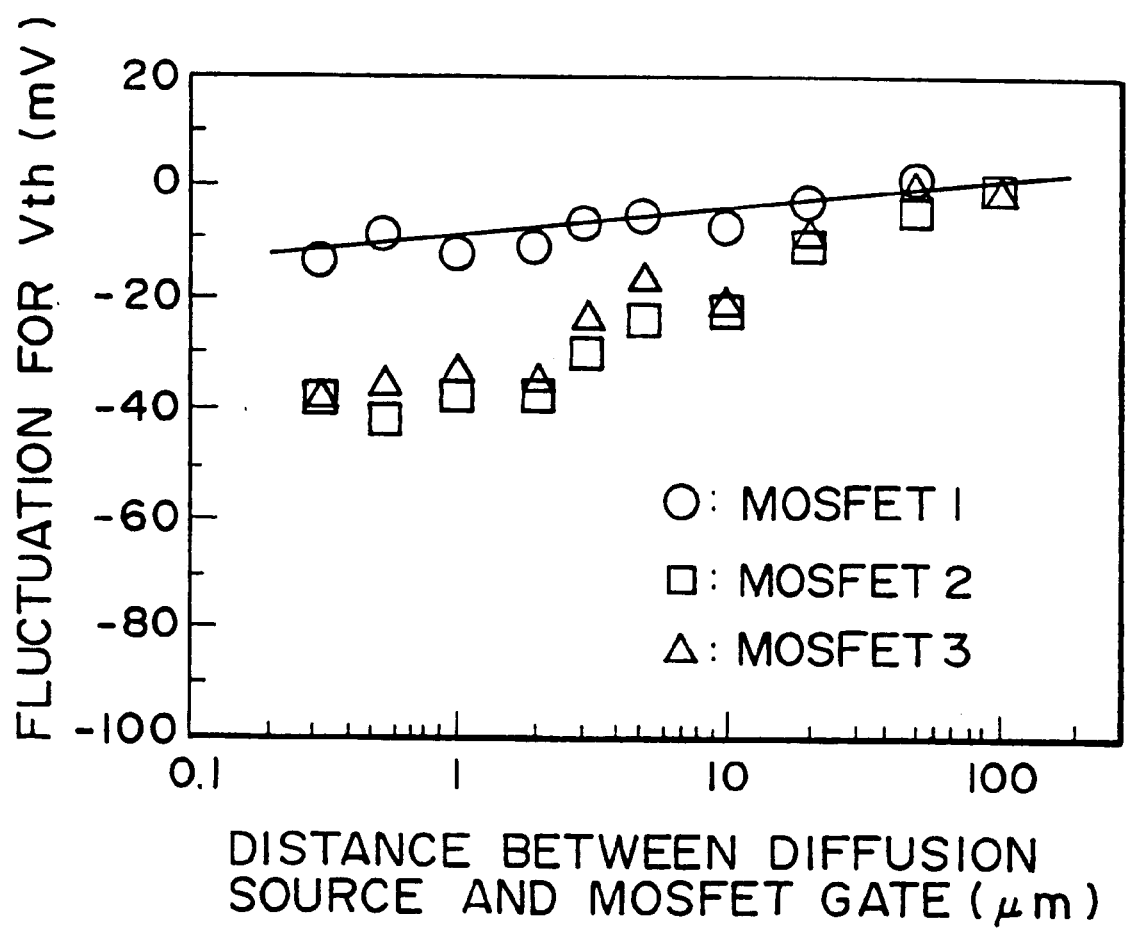
FIG. 5 is an explanatory view for the fluctuation of Vth of PMOSFET.

FIG. 4 shows fluctuation of Vth of NMOSFET and FIG. 5 shows fluctuation of Vth of PMOSFET.

Evaluated TEG has a structure of disposing a diffusion source of an opposite conduction type to the gate electrode of MOSFET. The diffusion source is formed as a $P^+$ type region in a case of the $N^+$ type electrode, while the diffusion source is formed as an N+ type region in a case of the $P^+$ type gate electrode.

In each of the figures, the ordinate represents the fluctuation amount of Vth, and the abscissa represents the distance between the diffusion source and the gate of MOSFET. In each of the figures, symbol "○" represents the case of MOSFET1 using, as a gate, a polycide structure explained for the first embodiment, that is, the polycide structure formed by forming the interlayer film 17 (SiO$_2$ at 1 nm thickness) on the polycrystal silicon layer (70 nm thickness of usual crystal grain size and, further, forming the polycrystal silicon layer of great grain size (70 nm). Symbol "□" represents a case of MOSFET 2 using, as a gate, a polycide structure prepared by stacking polycrystal silicon of large grain size (70 nm thickness) of a polycrystal silicon layer of usual grain size (70 nm thickness), and symbol "Δ" represents a case of MOSFET3 using the polycide structure of a single layer structure of large diameter polycrystal silicon (140 nm:thickness).

As shown in FIG. 4 and FIG. 5, MOSFET in which a polycrystal silicon structure formed with the interlayer film 17 for the gate shows the least fluctuation range for Vth and the absolute value for the fluctuation range is about 4 mV in average (at a distance to the diffusion source within a range from 0.3 μm to 10 μm) and about 12 mV at the maximum. In the case of PMOSFET, it was about 14 mV at the maximum.

On the other hand, MOSFET in which a polycide structure formed by stacking polycrystal silicon of large grain size on polycrystal silicon of usual grain size as a gate shows fluctuation (absolute value) of Vth of about 16 mv in average (distance to the diffusion source is within a range: 0.3 μm–10 μm) and about 18 mV at the maximum. Further, the value is about 40 mV at the maximum in the case of PMOSFET.

The MOSFET using the polycide structure of large grain size polycrystal silicon of a single layer structure as the gate shows fluctuation of Vth about equal with or greater than the fluctuation of vth of MOSFET using the polycide structure formed by stacking large crystal grain size polycrystal silicon on polycrystal silicon of usual grain size.

As described above, it can be seen that the fluctuation of Vth caused by the inter-diffusion of impurities can be effectively suppressed in MOSFET using a polycrystal silicon structure formed with the interlayer film 17 as the gate.

Accordingly, in a case of forming the gate of CMOSFET using a gate of the polycide structure having the first silicon layer and the second silicon layer of increased grain size, inter-diffusion between the gates of the CMOSFET can be suppressed and fluctuation of Vth can be suppressed. As a result, characteristics of CMOSFET can be improved.

As has been described above, according to the present invention, since the second silicon layer is formed on the first silicon layer after forming the interlayer film having a thickness within such a range as electrons in the first and the second electrons are conducted by direct tunneling and such a thickness as the succession of the crystallinity of the first silicon layer is disconnected upon crystallization of the second silicon layer, and the second silicon layer is crystallized and then a conductive layer made of metal silicide or a metal is formed, the polycrystal silicon can be increased to a large grain size in the second silicon layer without deteriorating electric characteristics between the first silicon and the second silicon.

Then, the above-mentioned characteristics can be obtained by forming the interlayer film with silicon oxide of 0.5 nm–3 nm.

As describe d above, by increasing the grain size of the second silicon layer as described above, diffusion of fluorine or boron into the first silicon layer can be suppressed. Further, in the structure in which N-type impurities and the P-type impurities are separated and introduced into the silicon layer, inter-diffusion of impurities to each other through the conductive layer can be suppressed by increasing the grain size of the second silicon layer.

Accordingly, when the structure of stacking the first silicon layer, the interlayer film, the second silicon layer and the conductive layer is applied to the gate of the MOS transistor, fluctuation of Vth of MOSFET can be suppressed.

What is claimed is:

1. A method of making a semiconductor device which comprises:

a step of forming a first silicon layer on a substrate, a step of forming a second silicon layer comprising an amorphous silicon on the first silicon layer, a step of doping n-type impurities in a first region of the second silicon layer and doping p-type impurities in a second region of the second silicon layer, a step of crystallizing the second silicon layer and diffusing the n-type impurities and the p-type impurities doped in the second silicon layer into the first silicon layer, a step of forming a conductive layer comprising a metal silicide or a metal on the crystallized second silicon layer, wherein the method comprises a step of forming an interlayer film to the surface of the first silicon layer after forming the first silicon layer and before forming the second silicon layer, in which the interlayer film has a film thickness within such range as electrons in the first and the second silicon layers are electrically conducted by direct tunneling and such a film thickness as disconnecting the succession of the crystallinity of the first silicon layer upon crystallization of the second silicon layer.

2. A method of making a semiconductor device as defined in claim 1, wherein the interlayer film comprises a silicon oxide film and has a thickness of from 0.5 nm to 3 nm.

3. A method of making a semiconductor device as defined in claim 2, wherein the silicon oxide film is formed by oxidizing the surface of the first silicon layer by using a liquid mixture of aqueous hydrogen peroxide and hydrofluoric acid, a liquid mixture of aqueous hydrogen peroxide and sulfuric acid, a liquid mixture of aqueous hydrogen peroxide and ammonia, or a liquid mixture of aqueous hydrogen peroxide and hydrochloric acid.

4. A method of making a semiconductor device as defined in claim 2 wherein the silicon oxide film is formed by thermally oxidizing the surface of the first silicon layer in a dinitrogen oxide atmosphere, an oxygen atmosphere, or an atmosphere of a gas mixture of oxygen and nitrogen.

5. A method of making a semiconductor device which comprises:

a step of forming a floating gate of a first silicon layer on a substrate, a step of forming a control gate of a second silicon layer comprising an amorphous silicon on the first silicon layer, a step of crystallizing the second silicon layer, and a step of forming a conductive layer comprising a metal silicide or a metal on the crystallized second silicon layer, wherein the method comprises a step of forming an interlayer film to the surface of the first silicon layer after forming the first silicon before forming the second silicon layer, in which the interlayer film has a film thickness within such a range as electrons in the first and the second silicon layers are electrically conducted by direct tunneling and such a film thickness as disconnecting the succession of the crystallinity of the first silicon layer upon crystallization of the second silicon layer.

6. A method of making a semiconductor device which comprises:

a step or forming a first gate on a first silicon layer on a substrate, a step of forming a second gate on a second silicon layer comprising an amorphous silicon on the first silicon layer, a step of doping n-type impurities in a first region of the second silicon layer and doping p-type impurities in a second region of the second silicon layer, a step of crystallizing the second silicon layer and diffusing the n-type impurities and the p-type impurities doped in the second silicon layer into the first silicon layer, a step of forming a conductive layer comprising a metal silicide or a metal on the crystallized second silicon layer, wherein the method comprises a step of forming an interlayer film to the surface of the first silicon layer after forming the first silicon layer and before forming the second silicon layer, in which the interlayer film has a film thickness within such a range as electrons in the first and the second silicon layers are electrically conducted by direct tunneling and such a film thickness as disconnecting the succession of the crystallinity of the first silicon layer upon crystallization of the second silicon layer.

7. A method of making a semiconductor device as defined in claim 5, wherein the interlayer film comprises a silicon oxide film and has a thickness of from 0.5 nm to 3 nm.

8. A method of making a semiconductor device as defined in claim 6, wherein the interlayer film comprises a silicon oxide film and has a thickness of from 0.5 nm to 3 nm.

9. A method of making a semiconductor device as defined in claim 7, wherein the silicon oxide film is formed by oxidizing the surface of the first silicon layer by using a liquid mixture of aqueous hydrogen peroxide and hydrofluoric acid, a liquid mixture of aqueous hydrogen peroxide and sulfuric acid, a liquid mixture of aqueous hydrogen peroxide and ammonia, or a liquid mixture of aqueous hydrogen peroxide and hydrochloric acid.

10. A method of making a semiconductor device as defined in claim 8, wherein the silicon oxide film is formed by oxidizing the surface of the first silicon layer by using a liquid mixture of aqueous hydrogen peroxide and fluoric acid, a liquid mixture of aqueous hydrogen peroxide and sulfuric acid, a liquid mixture of aqueous hydrogen peroxide and ammonia, or a liquid mixture of aqueous hydrogen peroxide and hydrochloric acid.

11. A method of making a semiconductor device defined in claim 7, wherein the silicon film is formed by thermally oxidizing the surface of the first silicon layer in a dinitrogen oxide atmosphere, an oxygen atmospheres or an atmosphere of gas mixture of a oxygen and nitrogen.

12. A method of making a semiconductor device as defined in claim 8, wherein the silicon oxide film is formed by thermally oxidizing the surface of the first silicon layer in a dinitrogen oxide atmosphere, an oxygen atmosphere, or an atmosphere of a gas mixture of oxygen and nitrogen.

13. A method of making a non-volatile semiconductor memory device which comprises:

a step of forming a floating gate of a first silicon layer on a substrate, a step of forming a control gate of a second silicon layer comprising an amorphous silicon on the first silicon layer, a step of crystallizing the second silicon layer, and a step of forming a conductive layer comprising a metal silicide or a metal on the crystallized second silicon layer, wherein the method comprises a step of forming an interlayer film to the surface of the first silicon layer after forming the first silicon layer and before forming the second silicon layer, in which the interlayer film has a film thickness within such a range as electrons in the first and the second silicon layers are electrically conducted by direct tunneling and such a film thickness as disconnecting the succession of the crystallinity of the first silicon layer upon crystallization of the second silicon layer.

14. A method of making a non-volatile semiconductor device which comprises a step of forming a floating ate of a first silicon layer on a substrate, a step of forming a control gate of a second silicon layer comprising an amorphous silicon on the first silicon layer, a step of doping n-type impurities in a first region of the second silicon layer and doping p-type impurities in a second region of the second silicon layer, a step of crystallizing the second silicon layer and diffusing the n-type impurities and the p-type impurities doped in the second silicon layer into the first silicon layer, a step of forming a conductive layer comprising a metal silicide or a metal on the crystallized second silicon layer, wherein the method comprises a step of forming an interlayer film to the surface of the first silicon layer after forming the first silicon layer and before forming the second silicon layer, in which the interlayer film has a film thickness within such a range as electrons in the first and the second silicon layers are electrically conducted by direct tunneling and such a film thickness as disconnecting a succession of the crystallinity of the first silicon layer upon crystallization of the second silicon layer.

15. A method of making a non-volatile semiconductor memory device as defined in claim 13, wherein the interlayer film comprises a silicon oxide film and has a thickness of from 0.5 nm to 3 nm.

16. A method of making a nonvolatile semiconductor memory device as defined in claim 14, wherein the interlayer film comprises a silicon oxide film and has a thickness of from 0.5 nm to 3 nm.

17. A method of making a non-volatile semiconductor memory twice as defined in claim 15, wherein the silicon oxide film is formed by oxidizing the surface of the first silicon layer by using a liquid mixture of aqueous hydrogen peroxide and hydrofluoric acid, a liquid mixture of aqueous hydrogen peroxide and sulfuric acid, a liquid mixture of aqueous hydrogen peroxide and ammonia, or a liquid mixture of aqueous hydrogen peroxide and hydrochloric acid.

18. A method of making a non-volatile semiconductor memory device as defined in claim 16, wherein
the silicon oxide film is formed by oxidizing the surface of the first silicon layer by using a liquid mixture of aqueous hydrogen peroxide and hydrofluoric acid, a liquid mixture of aqueous hydrogen peroxide and sulfuric acid, a liquid mixture of aqueous hydrogen peroxide and ammonia, or a liquid mixture of aqueous hydrogen peroxide and hydrochloric acid.

19. A method of making a non-volatile semiconductor memory device as defined in claim 15, wherein
the silicon oxide film is formed by thermally oxidizing the surface of the first silicon layer in a dinitrogen oxide atmosphere, an oxygen atmosphere, or an atmosphere of a gas mixture of oxygen and nitrogen.

20. A method of making a non-volatile semiconductor memory device as defined in claim 16, wherein
the silicon oxide film is formed by thermally oxidizing the surface of the first silicon layer in a dinitrogen oxide atmosphere, an oxygen atmosphere, or an atmosphere of a gas mixture of oxygen and nitrogen.

* * * * *